United States Patent
Brindani et al.

(10) Patent No.: US 10,911,051 B2
(45) Date of Patent: Feb. 2, 2021

(54) METHOD, SYSTEM AND DEVICE FOR RADIO FREQUENCY ELECTROMAGNETIC ENERGY DELIVERY

(71) Applicants: WHIRLPOOL CORPORATION, Benton Harbor, MI (US); Panasonic Corporation, Osaka (JP)

(72) Inventors: Franco Brindani, Ternate (IT); Andrea Gallivanoni, Casorate Sempione (IT)

(73) Assignees: Whirlpool Corporation, Benton Harbor, MI (US); Panasonic Corporation (JP)

(*) Notice: Subject to any disclaimer, the term of this patent is extended or adjusted under 35 U.S.C. 154(b) by 0 days.

(21) Appl. No.: 16/311,271

(22) PCT Filed: Dec. 21, 2016

(86) PCT No.: PCT/US2016/067928
§ 371 (c)(1),
(2) Date: Dec. 19, 2018

(87) PCT Pub. No.: WO2018/118034
PCT Pub. Date: Jun. 28, 2018

(65) Prior Publication Data
US 2020/0304127 A1 Sep. 24, 2020

(51) Int. Cl.
*H03L 5/02* (2006.01)
*H02J 50/20* (2016.01)
(Continued)

(52) U.S. Cl.
CPC .............. *H03L 5/02* (2013.01); *H02J 50/20* (2016.02); *H03L 7/07* (2013.01); *H05B 6/686* (2013.01); *H05B 6/705* (2013.01)

(58) Field of Classification Search
CPC .......... H05B 6/686; H05B 6/705; H03L 5/02; H03L 7/07; H02J 50/20
See application file for complete search history.

(56) References Cited

U.S. PATENT DOCUMENTS 5,371,481 A 12/1994 Tittanenen et al.
7,944,984 B1* 5/2011 Wu .................... H04L 27/364
375/261

(Continued)

FOREIGN PATENT DOCUMENTS

| JP | 2009272273 A | 11/2009 |
| JP | 2010004453 A | 1/2010 |
| WO | 2011033740 A1 | 3/2011 |

OTHER PUBLICATIONS

"Phase-locked Loop," Wikipedia, https://en.wikipedia.org/wiki/Phase-locked_loop.
(Continued)

*Primary Examiner* — Emil P Pham
(74) *Attorney, Agent, or Firm* — Price Heneveld LLP (57) ABSTRACT

An electromagnetic energy delivery system includes a set of radio frequency channels; each channel configured to receive a set of reference signals. Each channel further includes a compensation component and a phase-locked loop component. The compensation component can be configured to determine a phase difference between at least a subset of the reference signals; compare the phase difference with a predetermined reference phase difference; and determine a reference signal compensation offset value based on the comparison of the phase difference and the predetermined reference phase difference. The phase-locked loop component can be configured to generate a phase-shifted signal wherein the phase shift is based on at least the reference signal compensation offset value.

20 Claims, 9 Drawing Sheets

(51) Int. Cl.
*H03L 7/07* (2006.01)
*H05B 6/68* (2006.01)
*H05B 6/70* (2006.01)

(56) References Cited

U.S. PATENT DOCUMENTS

| | | | |
|---|---|---|---|
| 8,866,556 B2 | 10/2014 | Rogers | |
| 2007/0040510 A1 | 2/2007 | Matsumoto et al. | |
| 2012/0103972 A1* | 5/2012 | Okajima | H05B 6/705 219/490 |
| 2012/0103975 A1* | 5/2012 | Okajima | H05B 6/72 219/660 |
| 2012/0152939 A1 | 6/2012 | Nobue et al. | |
| 2015/0245424 A1* | 8/2015 | Brill | H05B 6/72 219/748 |
| 2015/0351164 A1 | 12/2015 | Wesson et al. | |
| 2016/0088847 A1* | 3/2016 | Torres | H05B 6/688 219/709 |
| 2018/0063901 A1* | 3/2018 | Nachtom | H05B 6/705 |

OTHER PUBLICATIONS

"Phase Shifters and I-Q Modulators," http://www.admiral-microwaves.co.uk/pdf/herley/herley-catalogue-phase-shifters.pdf, pp. 51-87.

* cited by examiner

METHOD, SYSTEM AND DEVICE FOR RADIO FREQUENCY ELECTROMAGNETIC ENERGY DELIVERY

BACKGROUND

The present device generally relates to a method and device for electromagnetic cooking, and more specifically, to a method and device for controlling the distribution of electromagnetic energy within a microwave oven.

A conventional microwave oven cooks food by a process of dielectric heating in which a high-frequency alternating electromagnetic field is distributed throughout an enclosed cavity. A sub-band of the radio frequency spectrum, microwave frequencies at or around 2.45 GHz cause dielectric heating primarily by absorption of energy in water.

To generate microwave frequency radiation in a conventional microwave, a voltage applied to a high-voltage transformer results in a high-voltage power that is applied to a magnetron that generates microwave frequency radiation. The microwaves are then transmitted to an enclosed cavity containing the food through a waveguide. Cooking food in an enclosed cavity with a single, non-coherent source like a magnetron can result in non-uniform heating of the food. To more evenly heat food, microwave ovens include, among other things, mechanical solutions such as a microwave stirrer and a turntable for rotating the food. A common magnetron-based microwave source is not narrowband and not tunable (i.e. emits microwaves at a frequency that is changing over time and not selectable). As an alternative to such a common magnetron-based microwave source, solid-state sources can be included in microwave ovens that are tunable and coherent.

SUMMARY

In one aspect, an electromagnetic energy delivery system includes a set of radio frequency channels; each channel configured to receive a set of reference signals. Each channel further includes a compensation component and a phase-locked loop component. The compensation component can be configured to determine a phase difference between at least a subset of the reference signals; compare the phase difference with a predetermined reference phase difference; and determine a reference signal compensation offset value based on the comparison of the phase difference and the predetermined reference phase difference. The phase-locked loop component can be configured to generate a phase-shifted signal wherein the phase shift is based on at least the reference signal compensation offset value.

In another aspect, a method of delivering radio frequency electromagnetic energy to cook foodstuff in an enclosed cavity of a cooking device includes receiving a set of reference signals; and, in parallel, repeatedly operating a compensation component for the set of reference signals and operating a phase-locked loop component. Operating a compensation component can include determining a phase difference between at least a subset of the reference signals; comparing the phase difference with a predetermined reference phase difference; and determining a reference signal compensation offset value based on the comparison of the phase difference and the predetermined reference phase difference. Operating a phase-locked loop component can generate a phase-shifted output signal based on at least the reference signal compensation offset value.

In another aspect, a radio frequency channel for generating a radio frequency signal based on a set of reference signals includes a compensation component and a phase-locked loop component. The compensation component can be configured to determine a phase difference between at least a subset of the reference signals; compare the phase difference with a predetermined reference phase difference; and determine a reference signal compensation offset value based on the comparison of the phase difference and the predetermined reference phase difference. The phase-locked loop component can be configured to generate a phase-shifted signal wherein the phase shift is based on at least the reference signal compensation offset value.

DETAILED DESCRIPTION

It is to be understood that the specific devices and processes illustrated in the attached drawings, and described in the following specification are simply exemplary embodiments of the inventive concepts defined in the appended claims. Hence, other physical characteristics relating to the embodiments disclosed herein are not to be considered as limiting, unless the claims expressly state otherwise.

A solid-state radio frequency (RF) cooking appliance heats up and prepares food by introducing electromagnetic radiation into an enclosed cavity. Multiple RF feeds at different locations in the enclosed cavity produce dynamic electromagnetic wave patterns as they radiate. To control and shape the wave patterns in the enclosed cavity, the multiple RF feeds can radiate waves with separately controlled electromagnetic characteristics to maintain coherence (that is, a stationary interference pattern) within the enclosed cavity. For example, each RF feed can transmit a different frequency, phase or amplitude with respect to the other feeds. Other electromagnetic characteristics can be common among the RF feeds. For example, each RF feed can transmit at a common but variable frequency.

Although the following embodiments are directed to a cooking appliance where RF feeds direct electromagnetic radiation to heat an object in an enclosed cavity, it will be understood that the methods described herein and the inventive concepts derived herefrom are not so limited. The covered concepts and methods are applicable to any RF device where more than one RF feed directs electromagnetic radiation to a shared space to act on an object. The shared space can include an enclosed cavity or an area in free space. Exemplary devices include ovens, dryers, steamers, and the like.

Figure 1:
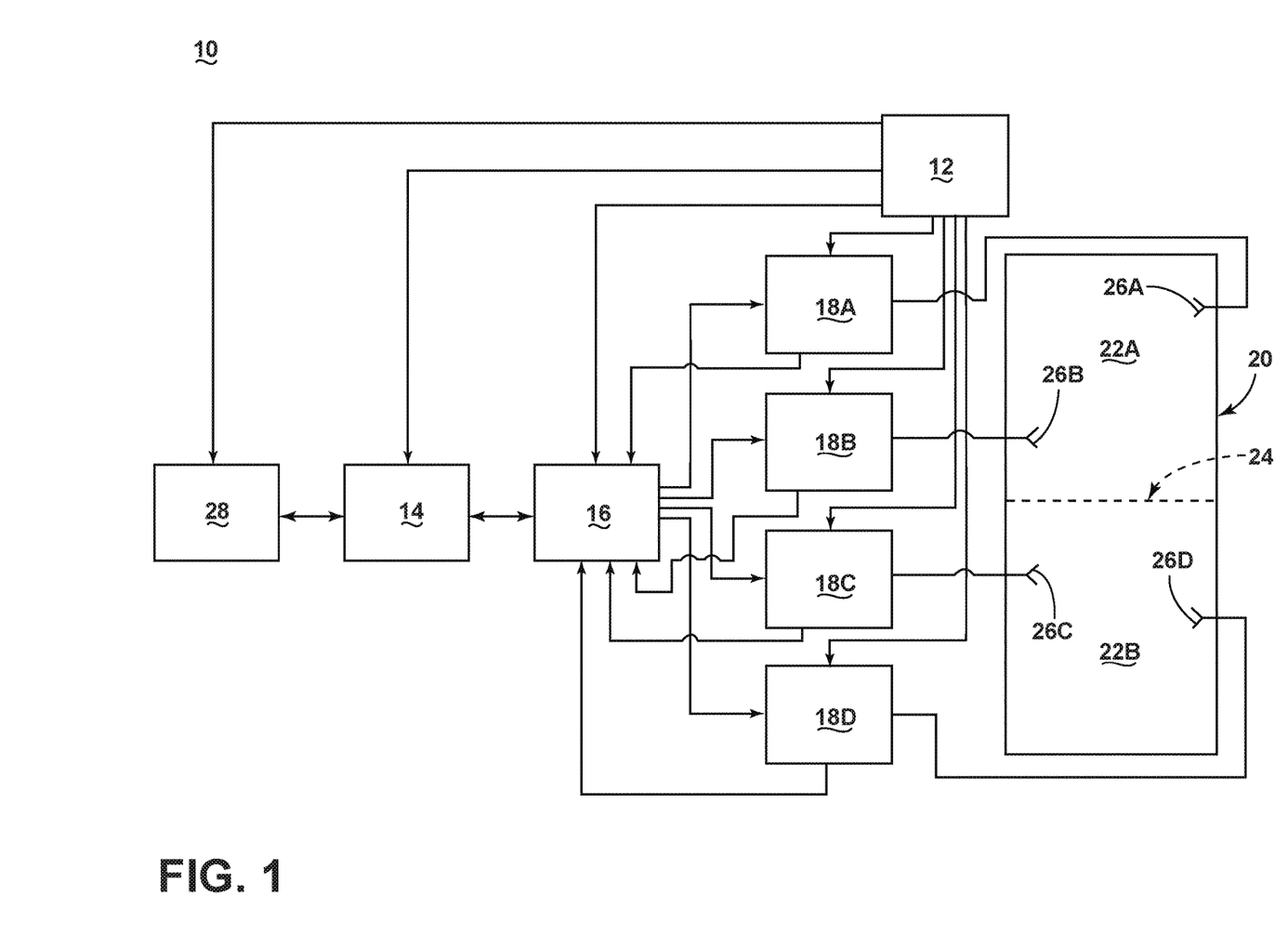
FIG. 1 is a block diagram illustrating an electromagnetic cooking device with multiple coherent radio frequency feeds in accordance with various aspects described herein.

FIG. 1 shows a block diagram of an electromagnetic cooking device 10 with multiple coherent RF feeds 26A-D according to one embodiment. As shown in FIG. 1, the electromagnetic cooking device 10 includes a power supply 12, a controller 14, an RF signal generator 16, a human-machine interface 28 and multiple high-power RF amplifiers 18A-D coupled to the multiple RF feeds 26A-D. The multiple RF feeds 26A-D each couple RF power from one of the multiple high-power RF amplifiers 18A-D into an enclosed cavity 20.

The power supply 12 provides electrical power derived from mains electricity to the controller 14, the RF signal generator 16, the human-machine interface 28 and the multiple high-power RF amplifiers 18A-D. The power supply 12 converts the mains electricity to the required power level of each of the devices it powers. The power supply 12 can deliver a variable output voltage level. For example, the power supply 12 can output a voltage level selectively controlled in 0.5-Volt steps. In this way, the power supply 12 can be configured to typically supply 28 Volts direct current to each of the high-power RF amplifiers 18A-D, but can supply a lower voltage, such as 15 Volts direct current, to decrease an RF output power level by a desired level.

A controller 14 can be included in the electromagnetic cooking device 10, which can be operably coupled with various components of the electromagnetic cooking device 10 to implement a cooking cycle. The controller 14 can also be operably coupled with a control panel or human-machine interface 28 for receiving user-selected inputs and communicating information to a user. The human-machine interface 28 can include operational controls such as dials, lights, switches, touch screen elements, and displays enabling a user to input commands, such as a cooking cycle, to the controller 14 and receive information. The user interface 28 can include one or more elements, which can be centralized or dispersed relative to each other. The controller 14 may also select the voltage level supplied by the power supply 12.

The controller 14 can be provided with a memory and a central processing unit (CPU), and can be preferably embodied in a microcontroller. The memory can be used for storing control software that can be executed by the CPU in completing a cooking cycle. For example, the memory can store one or more pre-programmed cooking cycles that can be selected by a user and completed by the electromagnetic cooking device 10. The controller 14 can also receive input from one or more sensors. Non-limiting examples of sensors that can be communicably coupled with the controller 14 include peak level detectors known in the art of RF engineering for measuring RF power levels and temperature sensors for measuring the temperature of the enclosed cavity or one or more of the high-power amplifiers 18A-D.

The RF signal generator 16 can include one or more components to determine and generate the actual frequencies, phases and amplitudes to be output to the high-power amplifiers. The RF signal generator 16 can include a programmable RF controlling component, preferably implemented as a digital control interface. The RF signal generator 16 can be physically separate from the cooking controller 14 or can be physically mounted onto or integrated into the controller 14. The RF signal generator 16 can be formed with electronic components suitable for generating RF signals including, but not limited to a bespoke integrated circuit.

As shown in FIG. 1, the RF signal generator 16 outputs four RF channels that share a common but variable frequency (e.g. ranging from 2.4 GHz to 2.5 GHz), but are settable in phase and amplitude for each RF feed 26A-D. The configuration described herein is exemplary and should not be considered limiting. For example, the RF signal generator 16 can be configured to output to more or less RF feeds and can include the capability to output a unique variable frequency for each of the channels depending upon the implementation.

Based on the user input provided by the human-machine interface 28 and data including the forward and backward (or reflected) power magnitudes coming from the multiple high-power amplifiers 18A-D (represented in FIG. 1 by the path from each of the high-power amplifiers 18A-D through the RF signal generator 16 to the controller 14), the controller 14 can determine the cooking strategy and calculate the settings for the RF signal generator 16. In this way, one of the main functions of the controller 14 is to actuate the electromagnetic cooking device 10 to instantiate the cooking cycle as initiated by the user. The RF signal generator 16 can generate multiple RF waveforms, that is, one for each high-power amplifier 18A-D based on the settings indicated by the controller 14.

The high-power amplifiers 18A-D, each coupled to one of the RF feeds 26A-D, each output a high power RF signal based on a low power common reference RF signal provided by the RF signal generator 16. The low power RF signal input to each of the high-power amplifiers 18A-D can be amplified by transforming the direct current electrical power provided by the power supply 12 into a high power RF signal. In one non-limiting example, each high-power amplifier 18A-D can be configured to output an RF signal ranging from 50 to 250 Watts. The maximum output wattage for each high-power amplifier can be more or less than 250 Watts depending upon the implementation. Each high-power amplifier 18A-D can include a dummy load to absorb excessive RF reflections.

The multiple RF feeds 26A-D couple power from the multiple high-power RF amplifiers 18A-D to the enclosed cavity 20. The multiple RF feeds 26A-D can be coupled to the enclosed cavity 20 in spatially separated but fixed physical locations. The multiple RF feeds 26A-D can be implemented via any structures designed for low power loss propagation of RF signals including, but not limited to, waveguides, antennas, etc. In one non-limiting example, metallic, rectangular waveguides known in microwave engineering are capable of guiding RF power from a high-power amplifier 18A-D to the enclosed cavity 20 with a power attenuation of approximately 0.03 decibels per meter.

Additionally, each of the RF feeds 26A-D can include a sensing capability to measure the magnitude of the forward and the backward power levels or phase at the amplifier output. The measured backward power indicates a power level returned to the high-power amplifier 18A-D as a result of an impedance mismatch between the high-power amplifier 18A-D and the enclosed cavity 20. Besides providing feedback to the controller 14 and the RF signal generator 16 to implement, in part, a cooking strategy, the backward power level can indicate excess reflected power that can damage the high-power amplifier 18A-D.

Along with the determination of the backward power level at each of the high-power amplifiers 18A-D, temperature sensing at the high-power amplifier 18A-D can provide data necessary to determine if the backward power level has exceeded a predetermined threshold. If the threshold is exceeded, any of the controlling elements in the RF transmission chain including the power supply 12, controller 14, the RF signal generator 16, or the high-power amplifier 18A-D can determine that the high-power amplifier 18A-D can be switched to a lower power level or completely turned off. For example, each high-power amplifier 18A-D can switch off automatically if the backward power level or sensed temperature is too high for several milliseconds. Alternatively, the power supply 12 can cut the direct current power supplied to the high-power amplifier 18A-D.

The enclosed cavity 20 can selectively include subcavities 22A-B by insertion of an optional divider 24 therein. The enclosed cavity 20 can include, on at least one side, a shielded door to allow user access to the interior of the enclosed cavity 20 for placement and retrieval of food or the optional divider 24.

The transmitted bandwidth of each of the RF feeds 26A-D can include frequencies ranging from 2.4 GHz to 2.5 GHz. The RF feeds 26A-D can be configured to transmit other RF bands. For example, the bandwidth of frequencies between 2.4 GHz and 2.5 GHz is one of several bands that make up the industrial, scientific and medical (ISM) radio bands. The transmission of other RF bands is contemplated and can include non-limiting examples contained in the ISM bands defined by the frequencies: 13.553 MHz to 13.567 MHz, 26.957 MHz to 27.283 MHz, 902 MHz to 928 MHz, 5.725 GHz to 5.875 GHz and 24 GHz to 24.250 GHz.

The electromagnetic cooking device 10 can deliver a controlled amount of power at multiple RF feeds 26A-D into the enclosed cavity 20. Further, by maintaining control of the amplitude, frequency and phase of the electromagnetic energy delivered from each RF feed 26A-D, the electromagnetic cooking device 10 can coherently control the power delivered into the enclosed cavity 20. Coherent RF sources deliver power in a controlled manner to exploit the interference properties of electromagnetic waves. That is, over a defined area of space and duration of time, coherent RF sources can produce stationary interference patterns such that the electric field is distributed in an additive manner. Consequently, interference patterns can add to create an electromagnetic field distribution that is greater in amplitude than any of the RF sources (i.e. constructive interference) or less than any of the RF sources (i.e. destructive interference).

The coordination of the RF sources and characterization of the operating environment (e.g. the enclosed cavity 20 and the contents within) can enable coherent control of the electromagnetic cooking and maximize the coupling of RF power with an object in the enclosed cavity 20. Efficient transmission into the operating environment can require calibration of the RF generating procedure. In an electromagnetic heating system, the power level can be controlled by many components including the voltage output from the power supply 12, the gain of the high-power amplifiers 18A-D, etc. Other factors that affect the output power level include the age of the components, inter-component interaction and component temperature.

Control of the interference patterns generated within the enclosed cavity 20 depends on the accuracy of the relative phase differences between the electromagnetic signals output from each RF feed 26A-D. The RF signal generator 16, the high-power amplifiers 18A-D and the RF feeds 26A-D of the electromagnetic cooking device 10 exemplify an RF electromagnetic energy delivery system that can be configured to concurrently output two or more periodic signals with the same frequency and an adjustable phase difference between the signals.

Figure 2:
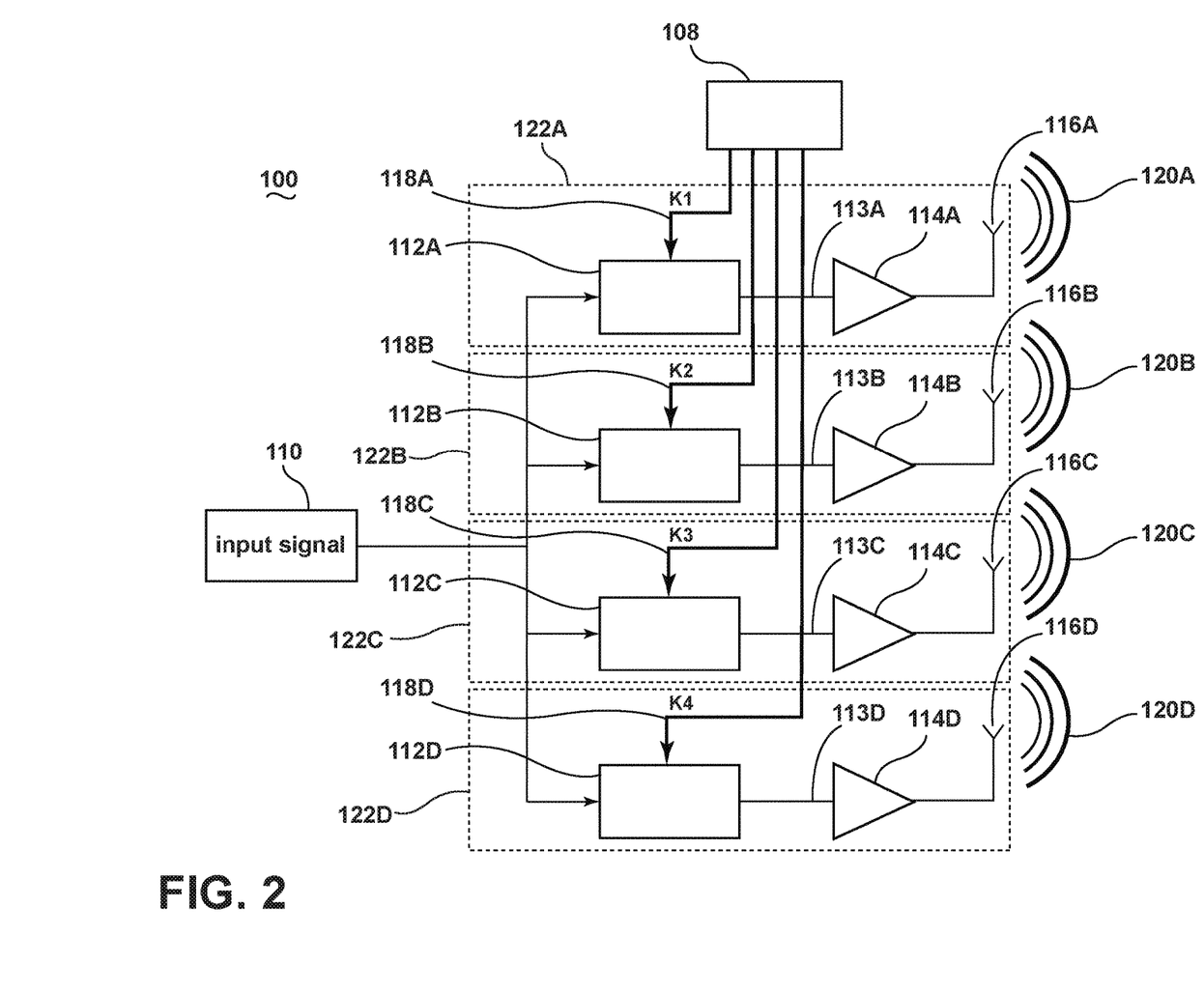
FIG. 2 is a block diagram illustrating an electromagnetic energy delivery system in accordance with various aspects described herein.

Referring now to FIG. 2, a block diagram of an RF electromagnetic energy delivery system 100 is shown. The electromagnetic energy delivery system 100 includes a set of phase shifting components 112A-D, amplifying components 114A-D and transmitting components 116A-D. The output of each phase shifting component 112A-D is coupled to the input of an amplifying component 114A-D. The output of each amplifying component 114A-D is coupled to the input of a transmitting component 116A-D. The signal path characterized by the serial coupling of a phase shifting component 112A-D to an amplifying component 114A-D to a transmitting component 116A-D forms an RF channel 122A-D.

A periodic input signal 110 is applied to each of the phase shifting components 112A-D. The periodic input signal 110 can be any signal suitable for amplification in an RF electromagnetic energy delivery system including, but limited to, a low power common reference RF signal provided by an RF signal generator (cf. element 16 in FIG. 1).

The phase shifting components 112A-D each output a periodic signal 113A-D that is displaced with respect to the periodic input signal 110. Because the signals are periodic, the displacement is described as a phase shift where the phase shift is the angle between two points on a circle that represents the progress of the periodic signal through its cycle. Each of the phase shifting components 112A-D are configured to output a periodic signal 113A-D with a selected phase difference with respect to the periodic input signal 110. The phase shifting components 112A-D can be formed with any electronics suitable for adjusting the phase of a periodic RF signal including, but not limited to, a digital programmable RF phase shifter.

The phase shifting components 112A-D can apply a phase shift to the input signal 110 according to a control signal 118A-D. The control signals 118A-D can specify a phase shift such that the output periodic signals 113A-D from the phase shifting components 112A-D each have a controlled phase difference with respect to the input signal 110. The phase difference between each of the output periodic signals 113A-D and the input signal 110 can range from 0 to 360 degrees. Additionally, the output periodic signals 113A-D can have a phase difference between one another ranging from 0 to 360 degrees. The control signals 118A-D can be formed of any signal suitable for controlling the phase shift output from a phase shifting component, including, but not limited to, digital words, K1-K4, output from a controller 108.

The phase shifter output signals 113A-D are input to the amplifying components 114A-D that drive each transmitting component 116A-D. The amplifying components 114A-D each output a high power RF signal based on the low power input signal 110 with a phase shift as applied by the phase shifting components 112A-D. The amplifying components 114A-D can be any amplifier suitable for amplifying an RF signal including but not limited to a solid-state high power amplifier (e.g. elements 18A-D in FIG. 1).

The transmitting components 116A-D convert the amplified electrical output of the amplifying components 114A-D into RF waves 120A-D. The transmitting components 116A-D can be formed from any structural components suitable for transmitting RF power and converting RF power into electromagnetic waves including, but not limited to, waveguides, antennas and combinations thereof (e.g. RF feeds 26A-D in FIG. 1). The RF waves 120A-D can be transmitted into any space suitable for the propagation of electromagnetic energy and can include an enclosed cavity (e.g. element 20 in FIG. 1) or free space depending upon the application.

The ability of the electromagnetic energy delivery system 100 to control the interference pattern generated by the RF waves 120A-D depends on the accuracy of the realized phase shift of the combination of the phase shifting components 118A-D and the added delay of the amplifying components 114A-D to the transmitting components 116A-D.

Figure 3:
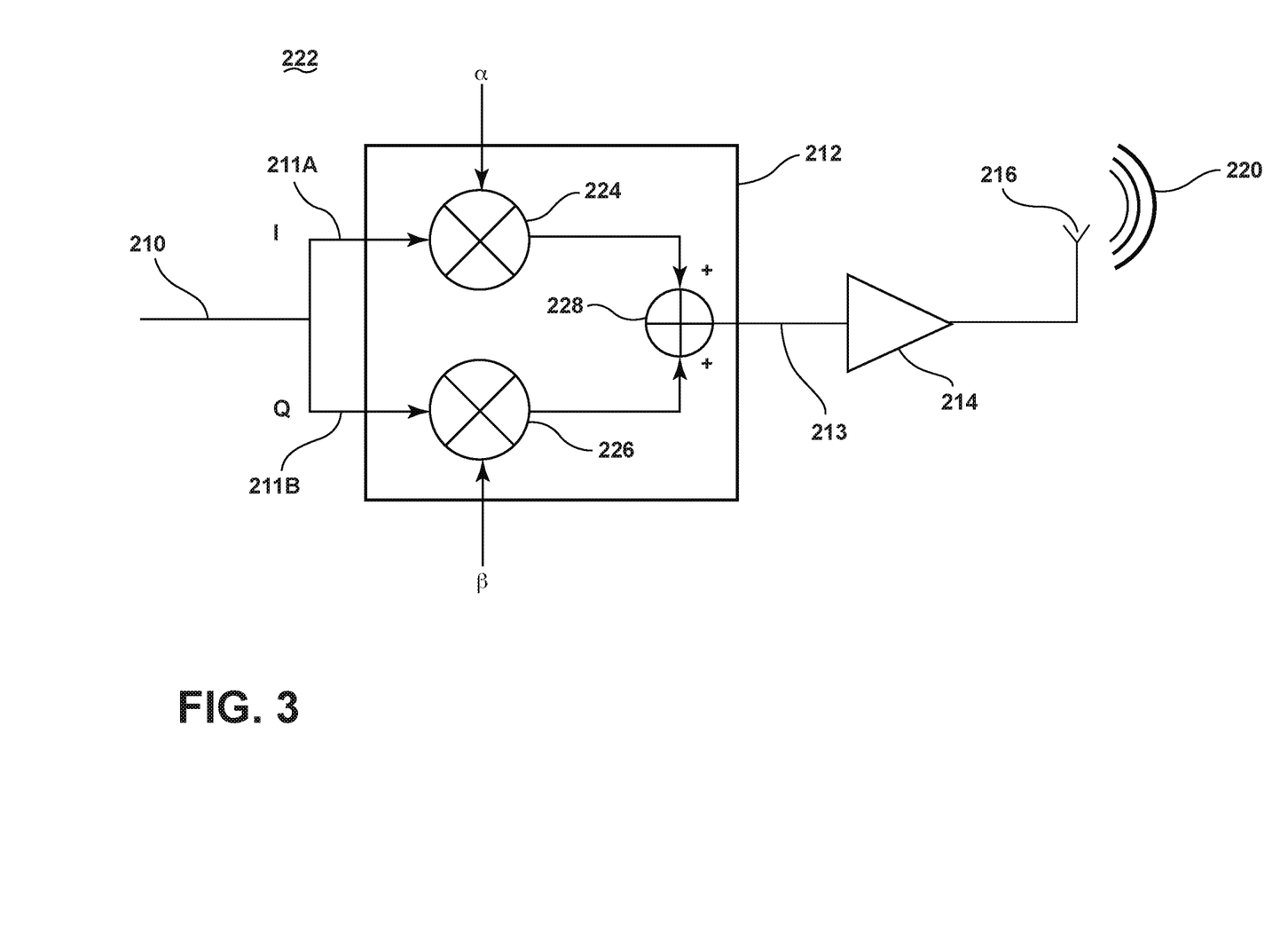
FIG. 3 is a block diagram illustrating an aspect of a single channel of an electromagnetic energy delivery system where the phase of an output signal is set in accordance with various aspects described herein.

Referring now to FIG. 3, a block diagram illustrating a single channel 222 of an electromagnetic energy delivery system where the phase of the output signal is set in accordance with various aspects described herein is shown. The channel 222 includes a phase shifting component 212, an amplifying component 214 and a transmitting component 216 coupled in series. The input signal 210 includes two amplitude-modulated sinusoids that have the same frequency and are offset in phase from one another by one-quarter cycle or 90 degrees. The two amplitude-modulated sinusoids are referred to in the art as quadrature signals and include an in-phase component 211A and a quadrature component 211B.

The phase shifting component 212 can include RF mixers 224, 226 that provide inputs to a summing amplifier 228. The phase shifted output signal 213 is formed as a linear combination of the two quadrature signals 211A, B such that a coefficient, $\alpha$, modulates the amplitude of the in-phase component 211A and a coefficient, $\beta$, modulates the amplitude of the quadrature component 211B. The amplitude modulated quadrature signals 211A, B are input to the summing amplifier 228. In this way, the phase shifted output signal 213 is a combination of the two quadrature signals 211A, B where the phase shift is determined by the values of the coefficients $\alpha$ and $\beta$.

The phase shifting component 212 outputs the phase shifted output signal 213 that is then input to the amplifying component 214. The amplifying component 214 outputs a high power RF signal that is an amplified version of the phase shifted output signal 213. The transmitting component 216 converts the amplified electrical output of the amplifying component 214 into RF wave 220. Multiple channels of an electromagnetic energy delivery system can be similarly configured and, in operation, can independently modulate the $\alpha$ and $\beta$ values for each channel.

To aid in the accurate construction and control of the interference patterns generated by an electromagnetic energy delivery system within an enclosed cavity (for example, element 20 in FIG. 1), a radio frequency channel can include a control system that generates an output signal whose phase is related to the phase of an input signal. Such a control system is typically referred to as a phase-locked loop (PLL).

Figure 4:
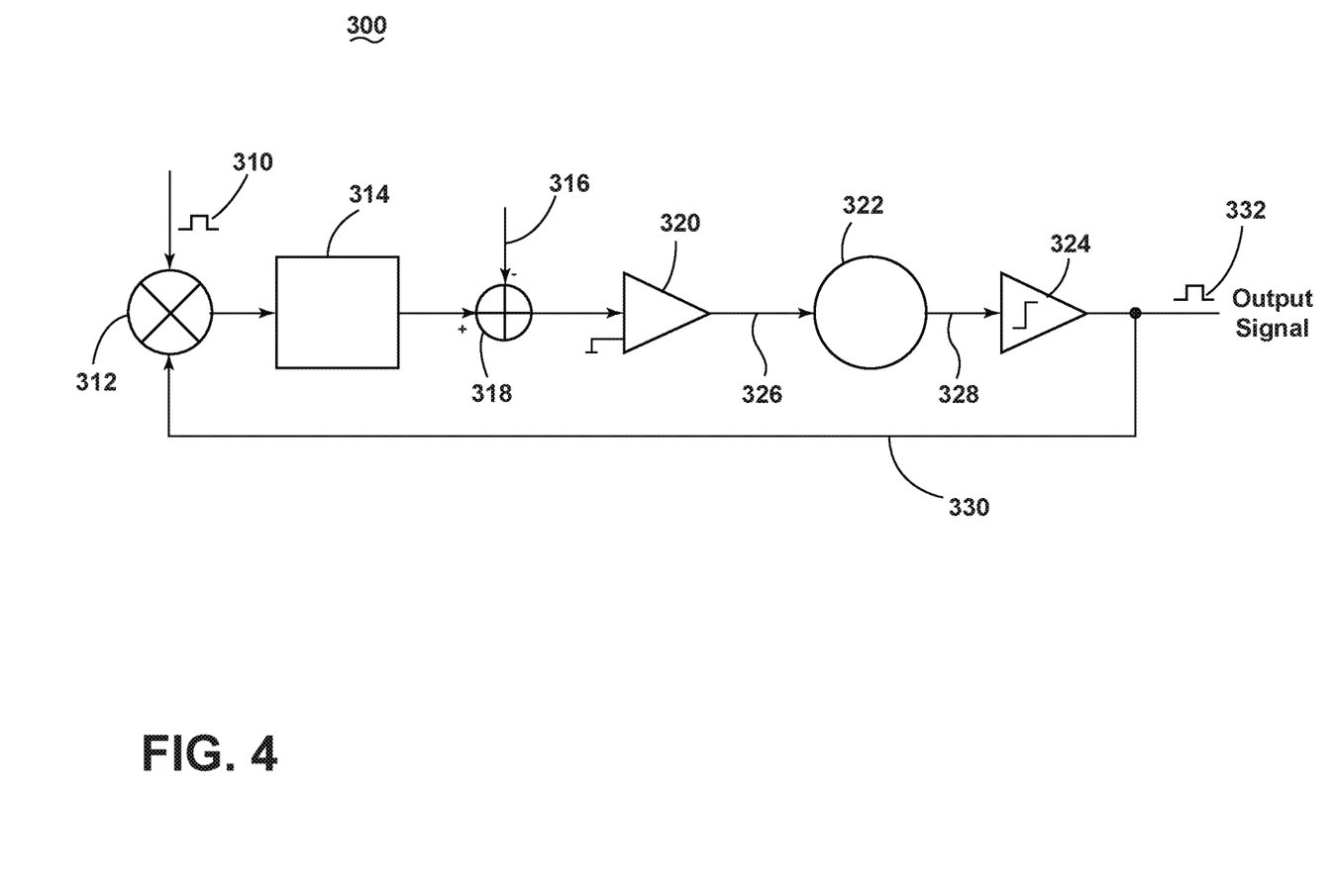
FIG. 4 is a is a block diagram illustrating an aspect of a single channel of an electromagnetic energy delivery system where the phase of an output signal is controlled by a phase-locked loop in accordance with various aspects described herein

Referring now to FIG. 4, a block diagram illustrating an aspect of a single channel 300 of an electromagnetic energy delivery system (for example, 10 in FIG. 1) where the phase of an output signal 332 is controlled by a phase-locked loop in accordance with various aspects described herein is shown. To implement a phase-locked loop, the single channel 300 can include phase-detecting components such as a signal mixer 312 and low pass filter 314, a voltage controlled oscillator 322 and a feedback loop 330. The feedback loop 330 brings the output signal 332 back toward an input reference signal 310. The single channel 300 generates the output signal 332 with a programmable phase difference relative to the input reference signal 310.

Together, the signal mixer 312 and low pass filter 314 acts as a phase-detecting component. The signal mixer 312 combines the reference signal with the output of the feedback loop 300. The mixed signal is input to the low pass filter 314. The signal mixer 312 and low pass filter 314 can be formed from any electrical components suitable for detecting the phase and stabilizing an input signal including, but not limited to, a double balanced mixer or Gilbert cell.

A summing amplifier 318 subtracts a known phase offset signal 316 encoded as a voltage from the output of the low pass filter 314. An amplifying component 320 amplifies any difference between the output of the low pass filter 314 and the known phase offset signal 316. The amplified output forms the voltage control signal 326 that drives the voltage controlled oscillator 322. The voltage controlled oscillator 322 can be formed of any type of electronic oscillator whose oscillation frequency is controlled by a voltage input, where the applied input voltage determines the instantaneous oscillation frequency. The output signal 328 of the voltage controlled oscillator 322 can be any type of modulated signal useful for controlling the phase of an output signal 332 of a radio frequency channel 300, including, but not limited to frequency modulated signals, phase modulated signals, etc.

A converting amplifier 324 can translate or amplify the output signal 328 of the voltage controlled oscillator 322 into an output signal 332 suitable for transmission out of the single channel 300. The converting amplifier 324 can be formed of any type of electronic device suitable for receiving one type of electronic signal and outputting another type of signal, including, but not limited to, digital-to-analog converters, analog-to-digital converters, frequency converters, voltage converters, frequency-to-voltage converters, voltage-to-frequency converters, current-to-voltage converters, Schmitt triggers and combinations thereof that can be configured with hardware or software.

In operation, the single channel 300 of an electromagnetic energy delivery system uses the feedback loop 330 to control the output signal 332 such that the output signal 332 settles at a desired phase difference as encoded by the phase offset signal 316 with respect to the reference signal 310. When the signal channel 300 includes a double balanced mixer to implement the signal mixer 312 and low pass filter 314, the feedback loop 330 employs negative feedback.

Figure 5:
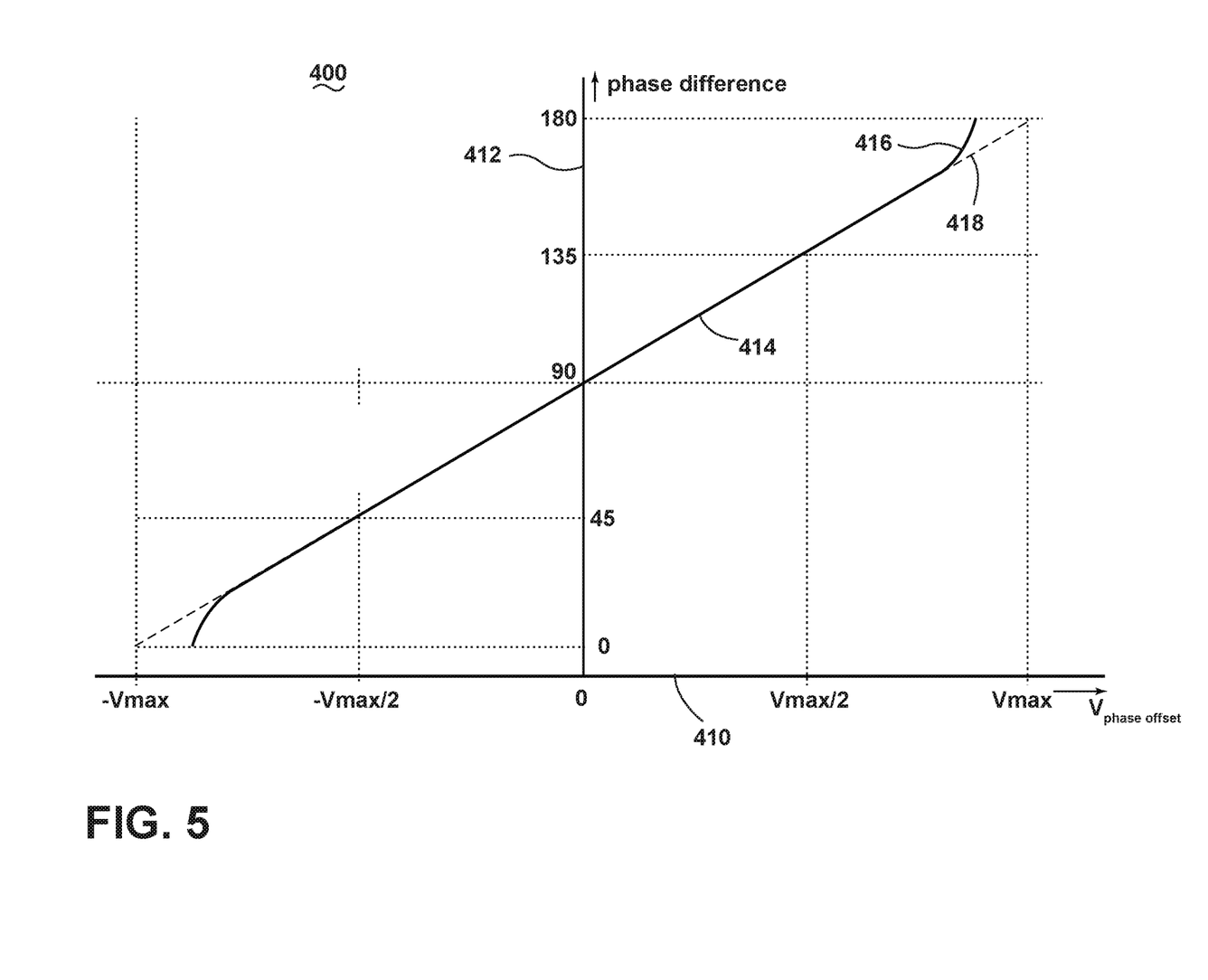
FIG. 5 is a diagram plotting a transfer function that characterizes the relationship between an applied phase offset voltage and the phase difference between the input signal and the output signals for a channel of an electromagnetic energy delivery system in accordance with various aspects described herein.

Referring now to FIG. 5, a transfer function 414 characterizing the relationship between an applied phase offset voltage 410 and the phase difference 412 in degrees between the input reference signal (for example, 310 in FIG. 4) and the output signal (for example, 332 in FIG. 4) for a channel of an electromagnetic energy delivery system is shown in the diagram 400. While an idealized transfer function 418 would be completely linear, the transfer function 414 in a realized channel is nonlinear. For example, as shown in FIG. 5, as the phase difference 412 in the transfer function 414 deviates from 90 degrees, the transfer function 414 includes nonlinear region 418. The degree of nonlinearity is a function of the process speed of the underlying electronics of the radio frequency channel and the frequency of the input and output signals. For higher frequencies (i.e. in the gigahertz range), the transfer function 414 can be considered sufficiently linear in an interval spanning a phase difference 412 on or about 45 degrees to on or about 90 degrees.

Therefore, for an electromagnetic energy delivery system (for example 10 in FIG. 1) capable of generating signals with all possible phase differences relative to a reference signal, one or more radio frequency channels (for example, 300 in FIG. 4) may employ multiple reference signals. In one non-limiting example, a radio frequency channel can employ a set of four reference signals where the members of the set are offset in phase by 90 degrees. Recalling the discussion of quadrature signals in FIG. 3, the four reference signals can be formed by the in-phase signal, the quadrature signal, the negative in-phase signal and the negative quadrature signal. The radio frequency channel can use any combination of electronics and software to generate the set of reference signals including, but not limited to, the use of differential signals where only the in-phase and quadrature components are generated and the negative in-phase and quadrature components are selected by swapping the differential signals with a switching matrix.

Figure 6:
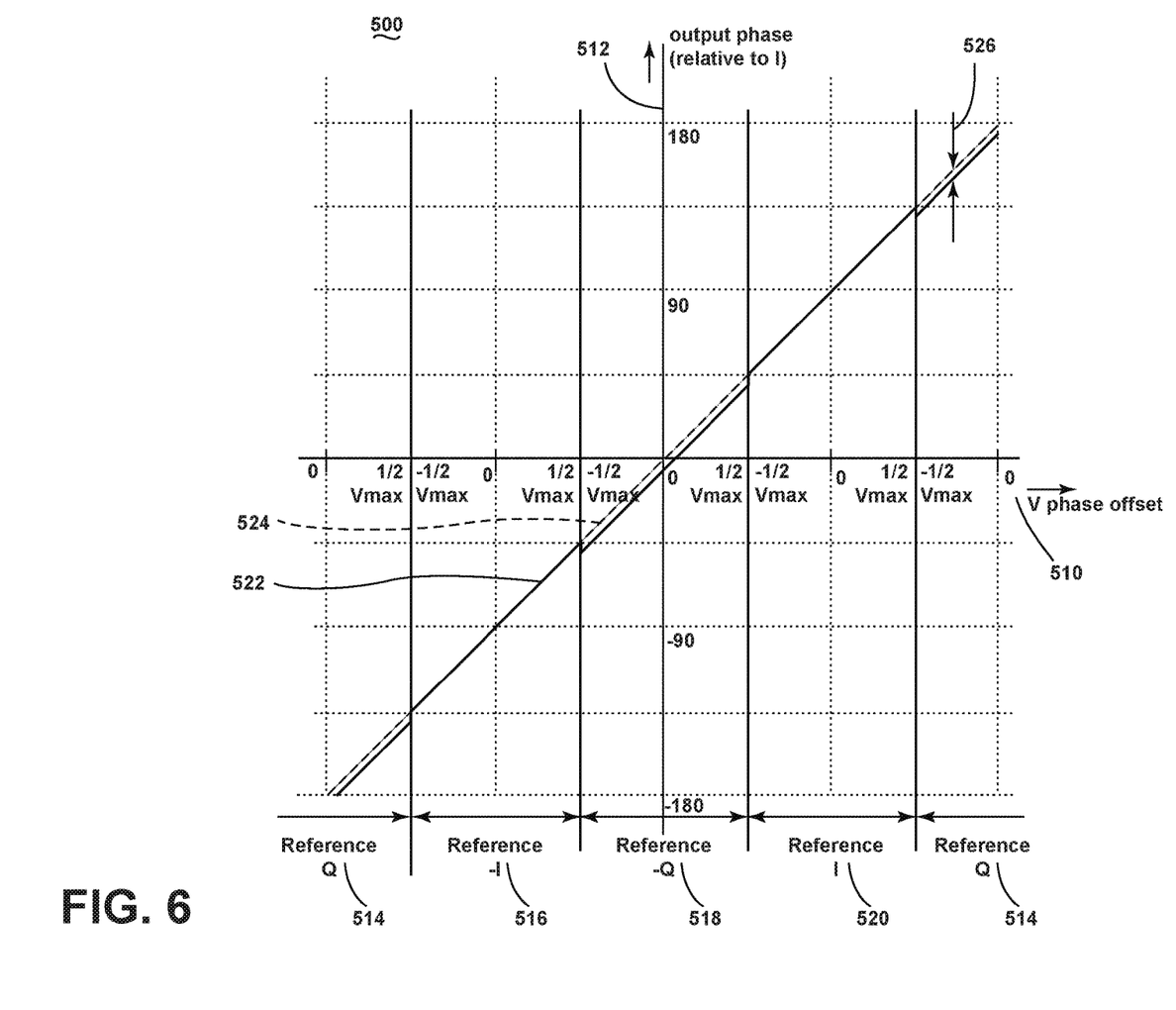
FIG. 6 is a diagram plotting a transfer function that characterizes the relationship between an applied phase offset voltage and the phase difference between the input signal and the output signals for a channel of an electromagnetic energy delivery system when multiple reference signals are used in accordance with various aspects described herein.

Referring now to FIG. 6, a transfer function 522 characterizing the relationship between an applied phase offset voltage 510 and the phase difference 512 between the in-phase reference signal and the output signal for a channel of an electromagnetic energy delivery system when multiple reference signals is shown. For a radio frequency channel with a phase-locked loop where the transfer function for the phase difference is sufficiently linear across a range of 90 degrees, a full 360-degree range of phase differences can be covered with a piecemeal set of four reference signals. The set of reference signals can include a quadrature signal 514, an in-phase signal 520, a negative in-phase signal 516 and a negative quadrature signal 518. Recall from FIG. 5 that the radio frequency channel with a phase-locked loop is sufficiently linear for a range centered at a 90 degree offset from the reference signal. Therefore, the radio frequency channel selects the in-phase signal 520 to output a signal with a phase difference with respect to the in-phase signal ranging from 45 to 135 degrees. Similarly, the radio frequency channel includes the quadrature signal 514 as a reference signal for an output signal with a phase difference ranging from 135 to 225 degrees, the negative in-phase signal 516 as a reference signal for an output signal with a phase difference ranging from 225 to 315 degrees and the negative quadrature signal 518 as a reference signal for an output signal with a phase difference ranging from 315 to 45 degrees.

However, when there is a phase error between the in-phase and quadrature reference signals such that they are not identically separated by 90 degrees, a phase error propagates through the radio frequency channel. When the radio frequency channel selects the quadrature signal 514 or negative quadrature signal 518 as a reference, the phase of the output signal can be shifted by some epsilon 526 from the intended ideal transfer function 524. When multiple reference signals are selected, the phase-detecting components of the radio frequency channel copies the phase error between the reference signals into the measurement of the phase difference.

Figure 7:
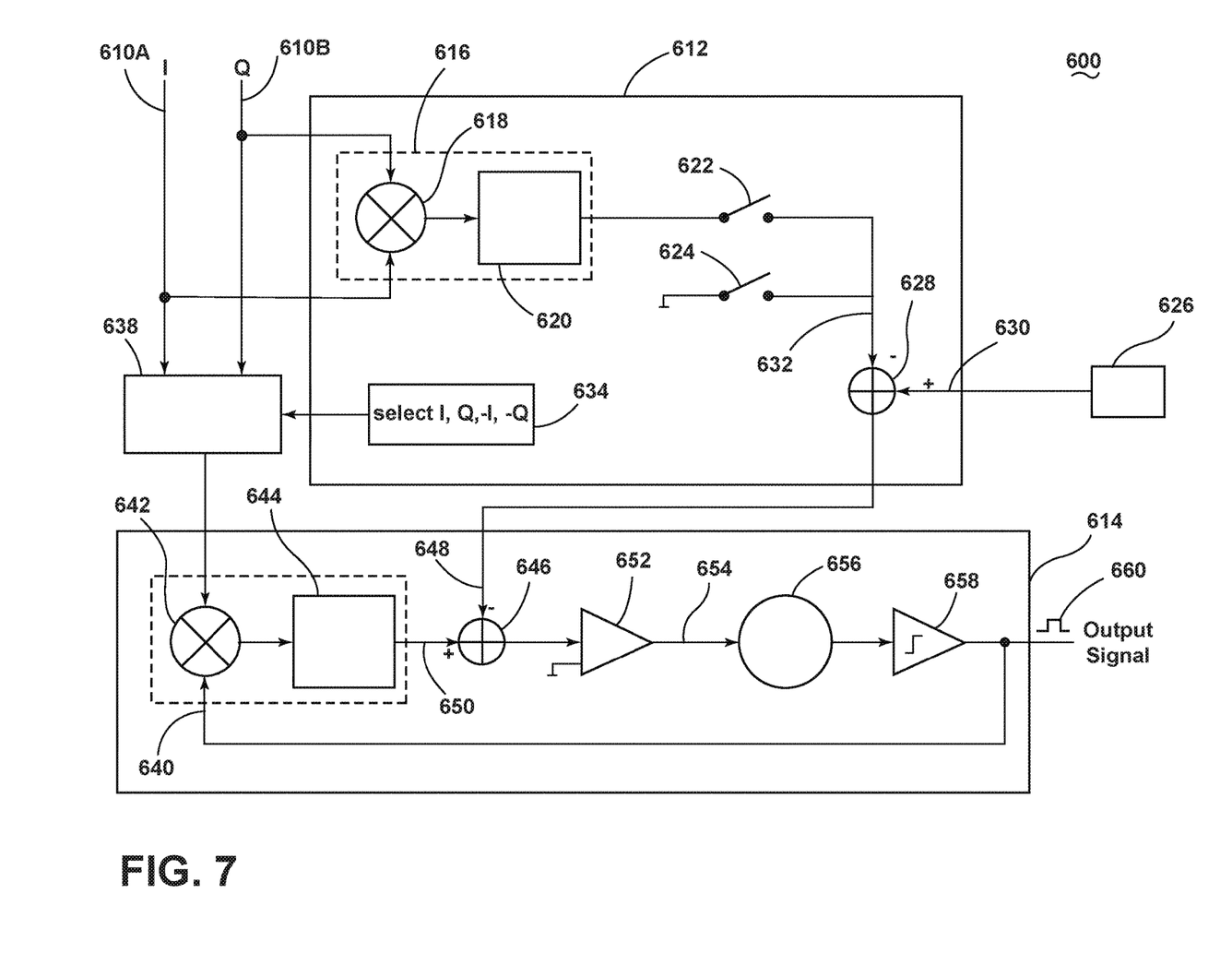
FIG. 7 is a diagram illustrating an embodiment of a radio frequency channel with a phase compensating component in accordance with various aspects described herein.

Referring now to FIG. 7, a block diagram illustrating a radio frequency channel 600 with a compensation component 612 for compensating a phase error between the in-phase and quadrature reference signals 610A,B is shown. Similar to the channel described in FIG. 4, the radio frequency channel 600 includes a phase-locked loop component 614. The set of reference signals 610A, B can be coupled in parallel to both the compensation component 612 and the phase-locked loop component 614. The reference signals 610A, B can be directly coupled to a switching matrix 638 that is selectively configured to output one reference signal from a set of reference signals. The reference signal can be selected by a reference selecting component 634 which can be any suitable controller useful for selecting one of a set of reference signals including, but not limited to, a digital control interface.

The compensation component 612 includes a phase measuring component 616. The phase measuring component 616 can include a signal mixer 618 coupled in series to a low pass filter 620. The in-phase signal 610A and the quadrature signal 610B can be input to the signal mixer 618, the result of which can be filtered through the low pass filter 620. The phase measuring component 616 including the signal mixer 618 and low pass filter 620 can be formed from any electrical components suitable for detecting the phase and stabilizing an input signal including, but not limited to, a double balanced mixer or Gilbert cell.

A signal indicative of the measured phase error output from the phase detection component 616 is coupled to the switches 622, 624. The current reference signal selected from the set of reference signals determines the state of the switches 622, 624. When the quadrature or negative quadrature signals are used as reference signals, the switch 622 can be set to a closed state and the switch 624 set to an open state. The phase error output 632 provides an input to the summing amplifier 628. A desired phase offset 630 is coupled to the summing amplifier 628. The desired phase offset 630 can originate from any suitable RF controlling component including, but not limited to, a controller 626 such as a digital control interface. The summing amplifier 628 is configured to subtract the phase error output 632 from the desired phase offset 630 and output a compensated phase offset 648. In this way, the phase detection component 616 can be used to compensate for the phase error in the phase-locked loop component 614. When the in-phase or negative in-phase signals are used as reference signals, the switch 622 can be set to an open state and the switch 624 set to a closed state thereby setting the phase error output 632 to zero. That is, when the in-phase or negative in-phase signals are used as reference signals, no compensation is needed.

The phase-locked loop component 614 can include phase-detecting components such as a signal mixer 642 and low pass filter 644, a voltage controlled oscillator 656 and a feedback loop 640. The feedback loop 640 brings the output signal 660 back toward an input reference signal that is output from the switching matrix 638. The phase-locked loop component 614 can generate the output signal 660 with a programmable phase difference relative to the input reference signal output from the switching matrix 638.

The signal mixer 642 and low pass filter 644 acts as a phase-detecting component. The signal mixer 642 combines the selected reference signal output from the switching matrix 638 with the output of the feedback loop 640. The mixed signal is input to the low pass filter 644. The signal mixer 642 and low pass filter 644 can be formed from any electrical components suitable for detecting the phase and stabilizing an input signal including, but not limited to, a double balanced mixer or Gilbert cell.

A summing amplifier 646 subtracts the compensated phase offset 648 from the output 650 of the low pass filter 644. An amplifying component 652 can amplify any difference between the output 650 of the low pass filter 644 and the compensated phase offset signal 648. The amplified output forms the voltage control signal 654 that drives the voltage controlled oscillator 656. The voltage controlled oscillator 656 can be formed of any type of electronic oscillator whose oscillation frequency is controlled by a voltage input, where the applied input voltage determines the instantaneous oscillation frequency.

A converting amplifier 658 can translate or amplify the output signal of the voltage controlled oscillator 656 into an output signal 660 suitable for transmission out of the phase compensating radio frequency channel 600. The converter amplifier 658 can be formed of any type of electronic device suitable for receiving one type of electronic signal and outputting another type of signal, including, but not limited to, digital-to-analog converters, analog-to-digital converters, frequency converters, voltage converters, frequency-to-voltage converters, voltage-to-frequency converters, current-to-voltage converters, Schmitt triggers and combinations thereof that can be configured with hardware or software.

In operation, the radio frequency channel 600 can perform a phase error measurement continuously, in part, due to the phase measuring component 616 in the compensation component 612. In this way, the channel 600 is configured to, in parallel, repeatedly operate the compensation component 612 and the phase-locked loop component 614 to generate the phase-shifted output signal 660 based on the reference signal compensated phase offset 648.

Figure 8:
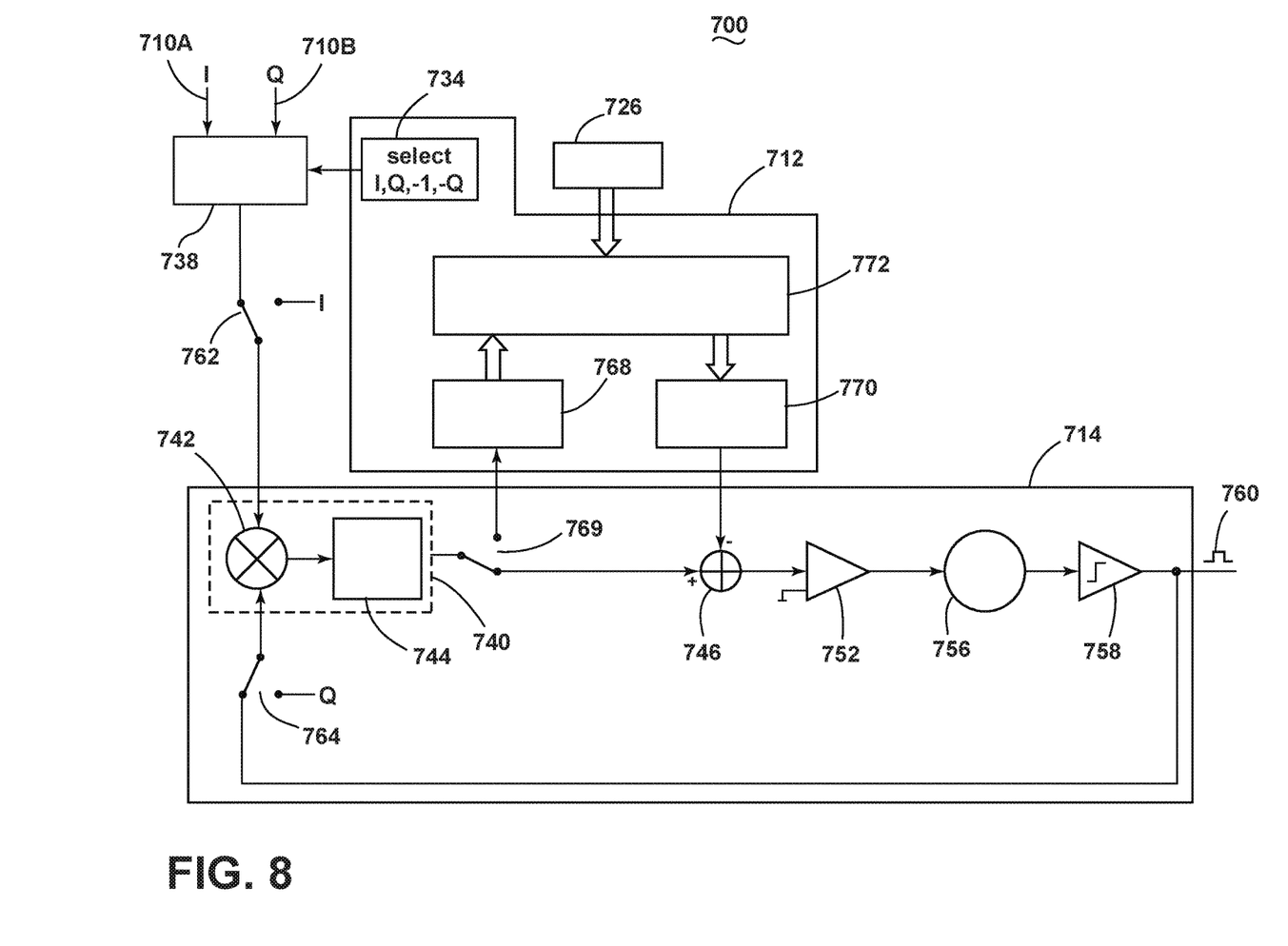
FIG. 8 is a diagram illustrating another embodiment of a radio frequency channel with a phase compensating component in accordance with various aspects described herein.

Referring to FIG. 8, a second embodiment of a radio frequency channel 700 with a compensation component 712 is shown. The radio frequency channel 700 is similar to the single channel 600 depicted in FIG. 7. Therefore, like parts will be identified with like numerals increased by 100, with it being understood that the description of the like parts of the embodiment shown in FIG. 7 applies to the embodiment shown in FIG. 8, unless otherwise noted. In embodiment shown, the compensation component 712 can measure and store the phase error and then apply the compensated phase offset to the phase-locked loop component 714 when the quadrature or negative quadrature reference signal is in use. That is, the radio frequency channel 700 can operate in a normal operation mode or a calibration mode.

The switches 762, 764, 769 can toggle between the normal operation mode and the calibration mode. In calibration mode, the phase error between the quadrature and in-phase reference signals can be measured. The switch 762 is configured to couple to an in-phase reference signal. The switch 764 is configured to couple to a quadrature reference signal. The switch 769 is configured to direct the output of the phase measuring component 740 of the phase-locked loop component 714. In this way, the phase measuring component 740 can measure the phase error between the quadrature and in-phase reference signals. The measured phase error is input to a converter block 768. The converter block 768 can translate the phase error signal into a value appropriate for input to an electronic storage component 772. The converter block 768 can be formed of any type of electronic device suitable for receiving one type of electronic signal and outputting another type of signal, including, but not limited to, analog-to-digital converters, digital-to-analog converters, frequency converters, voltage converters, frequency-to-voltage converters, voltage-to-frequency converters, current-to-voltage converters and combinations thereof that can be configured with hardware or software.

The electronic storage component 772 can store the measured phase error as well as a desired phase offset transmitted from a controller 726. The electronic storage component 772 and controller 726 can be formed of one or more components suitable for reading, storing and transmitting electronic signals, including, but not limited to, a digital control interface. The electronic storage component 772 can output a phase compensated signal to a converter block 770. The converter block 770 can translate the value stored in the electronic storage component 772 into a phase error signal appropriate for input to the summing amplifier 746. The converter block 770 can be formed of any type of electronic device suitable for receiving one type of electronic signal and outputting another type of signal, including, but not limited to, digital-to-analog converters, analog-to-digital converters, frequency converters, voltage converters, frequency-to-voltage converters, voltage-to-frequency converters, current-to-voltage converters and combinations thereof that can be configured with hardware or software.

In normal operations mode, the switches 762, 764, 768 are configured to inject a reference signal into the phase-locked loop component 714. The stored phase error from the calibration mode is subtracted by the summing amplifier 746 when the quadrature or negative quadrature reference signal is used as the reference signal for the phase-locked loop component 714. In this way, the phase-locked loop includes a compensated phase offset signal to correct for errors between the quadrature and in-phase reference signals.

Figure 9:
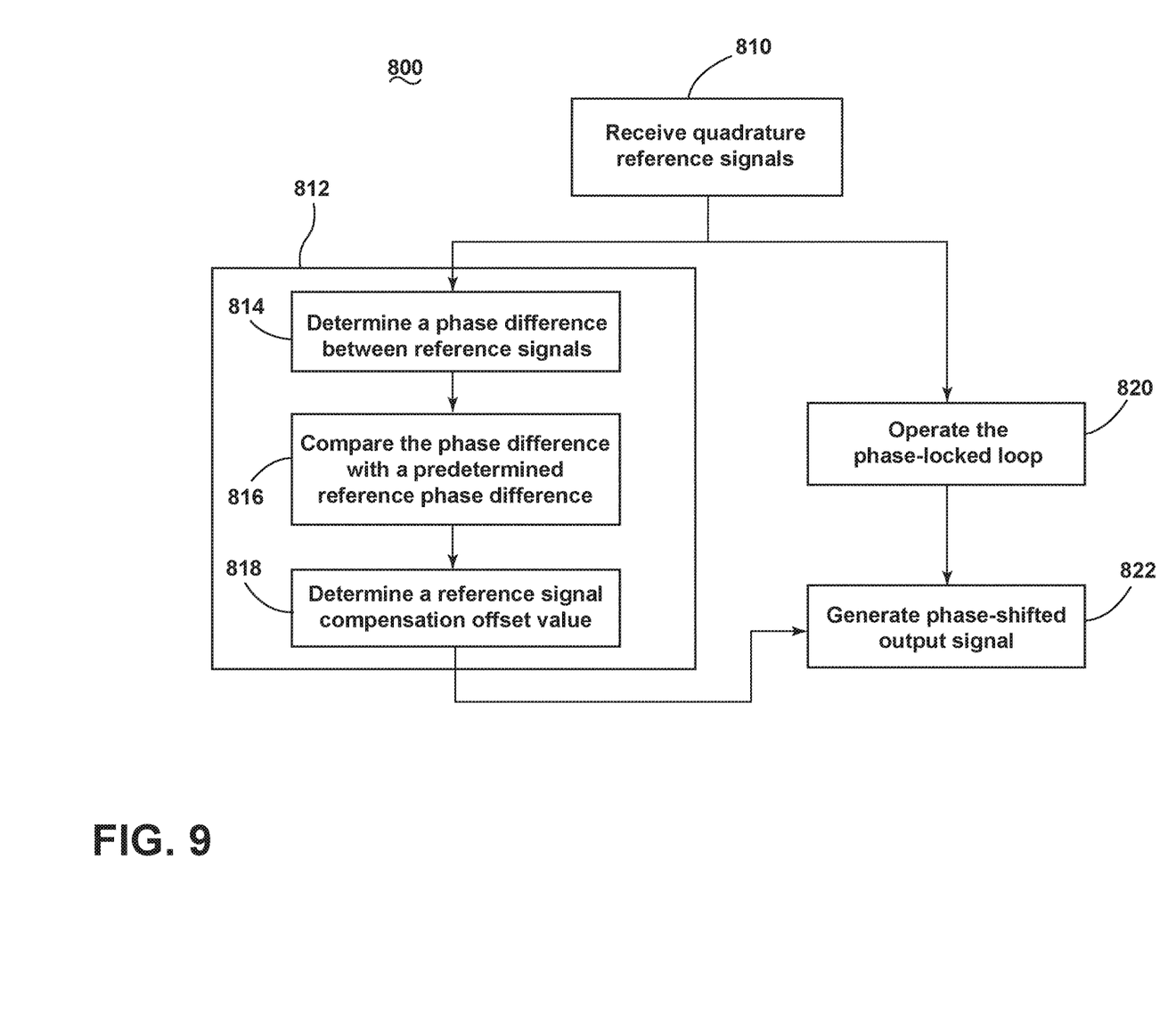
FIG. 9 is a flowchart illustrating a method of generating a phase-shifted output signal in a phase-locked in accordance with various aspects described herein.

Referring now to FIG. 9, a flowchart illustrating a method 800 of generating a phase-shifted output signal in a phase-locked loop in accordance with various aspects described herein is shown. The method 800 includes steps to: receive a set of quadrature reference signals, operate a compensation component, operate a phase-locked loop component and generate a phase-shifted output signal. Operating the compensation component can include steps to: determine a phase difference between reference signals, compare the phase difference with a predetermined reference phase difference and determine a reference signal compensation offset value. A radio frequency channel can generate the phase-shifted output signal by operating the compensation component and the phase-locked loop component in parallel.

At step 810, the radio frequency channel of an electromagnetic energy delivery system can receive one or more of a set of quadrature reference signals. The set of reference signals can be any periodic signal including, but not limited to, two amplitude-modulated radio frequency sinusoids that have the same frequency and are offset in phase from one another by a fixed amount such as one-quarter cycle or 90 degrees, two radio frequency sinusoids that are inverted from one another and combinations thereof. For example, the set of reference signals can include an in-phase, a quadrature, a negative in-phase and a negative quadrature signal.

At step 812, the radio frequency channel of an electromagnetic energy delivery system can be configured to operate a compensation component. Operating a compensation component, the radio frequency channel can, at step 814, determine a phase difference between reference signals. For example, the compensation component can include a phase measuring component to determine the phase difference between a quadrature and in-phase reference signal. The radio frequency channel can be configured to compare, at step 816, the determined phase difference with a predetermined reference phase difference. In this way, the radio frequency channel can be configured to determine a phase error between the reference signals. For example, the radio frequency channel can be configured to determine an error between an in-phase and quadrature reference signal if the determined phase difference is not 90 degrees. At step 818, the radio frequency channel can determine a reference signal compensation offset value. The value represents the offset needed to be injected into the phase-locked loop component of the radio frequency channel to correct for the phase difference between the reference signals. The value can be any form suitable for compensating for the phase error, including, but not limited to, a digital signal, an analog signal, a voltage, a current, etc.

At step 820, the radio frequency channel of an electromagnetic energy delivery system can be configured to operate a phase-locked loop component. The phase-locked loop component includes a feedback loop for adjusting the phase of an output signal to settle to a desired output phase. At step 822, the radio frequency channel of an electromagnetic energy delivery system can be configured to generate the phase-shifted output signal. Each of the radio frequency channels of an electromagnetic energy delivery system can be configured to deliver an output radio frequency signal such as by transmitting the signal from an antenna. In a cooking application as described above for FIG. 1, each channel can be configured to output the radio frequency signal to an enclosed cavity, which holds foodstuff to be cooked according to a cycle of operation. The electromagnetic energy delivery system can include any suitable techniques and components for determining and controlling the modulation of the phase of the output RF signal for each channel. Techniques and components can include, but are not limited to, feedback and feedforward topologies, RF phase shifters, processors, loop amplifiers, etc.

As described above, the method includes steps to determine and set the phase of a set of radio frequency electromagnetic energy transmissions. The method enables a radio frequency electromagnetic energy delivery system such as can be implemented in a solid-state electromagnetic cooking device to accurately transmit a set of radio frequency signals with a desired set of phase differences. The method results in better coherence of the output radio frequency signals because the resultant phase differences in the transmitted signals approach the desired phase differences by correcting for errors and biases in the quadrature reference signals.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

What is claimed is:

1. An electromagnetic energy delivery system comprising:
   a set of radio frequency (RF) channels, each RF channel configured to receive a set of reference signals and comprising:
      a phase compensation component configured to determine a phase difference between at least a subset of the reference signals; compare the phase difference with a predetermined reference phase difference; and determine a reference signal compensation offset value based on a comparison of the phase difference and the predetermined reference phase difference; and
      a phase-locked loop component configured to generate a phase-shifted signal wherein the phase shift is based on at least the reference signal compensation offset value.

2. The electromagnetic energy delivery system of claim 1 wherein the phase compensation component and the phase-locked loop component are operated repeatedly in parallel.

3. The electromagnetic energy delivery system of claim 1 wherein the phase-locked loop component further includes an amplifying component configured to amplify the power of the phase-shifted signal.

4. The electromagnetic energy delivery system of claim 1 wherein the phase-locked loop component further includes a phase-measuring component configured to measure the phase difference between one reference signal of the set of reference signals and the phase-shifted signal.

5. The electromagnetic energy delivery system of claim 1 wherein the phase compensation component further includes a phase-measuring component configured to measure the phase difference between two reference signals of the set of reference signals.

6. The electromagnetic energy delivery system of claim 4 wherein the phase-measuring component comprises a double balanced mixer.

7. The electromagnetic energy delivery system of claim 4 wherein the phase-measuring component comprises a Gilbert cell.

8. The electromagnetic energy delivery system of claim 1 wherein the set of reference signals is directly coupled to a switching matrix that is configured to output one reference signal of the set of reference signals to the phase-locked loop component.

9. The electromagnetic energy delivery system of claim 1 further including an enclosed cavity in which radio frequency feeds radiate electromagnetic energy.

10. A method of generating a radio frequency signal with an electromagnetic energy delivery system, comprising:
receiving a set of reference signals; and
in parallel, repeatedly operating a compensation component for the set of reference signals by:
determining a phase difference between at least a subset of the reference signals;
comparing the phase difference with a predetermined reference phase difference;
determining a reference signal compensation offset value based on said comparing of the phase difference and the predetermined reference phase difference; and
operating a phase-locked loop component to generate a phase-shifted output signal based on at least the reference signal compensation offset value.

11. The method of claim 10 wherein operating the phase-locked loop component includes amplifying the power of the phase-shifted output signal.

12. The method of claim 10 wherein the set of reference signals comprises at least two periodic signals with the same frequency and a fixed phase difference.

13. The method of claim 12 wherein the fixed phase difference is around 90 degrees.

14. A radio frequency (RF) channel for generating a radio frequency signal based on a set of reference signals, the RF channel comprising:
a phase compensation component configured to determine a phase difference between at least a subset of the reference signals, compare the phase difference with a predetermined reference phase difference, and determine a reference signal compensation offset value based on a comparison of the phase difference and the predetermined reference phase difference; and
a phase-locked loop component configured to generate a phase-shifted signal wherein the phase shift is based on at least the reference signal compensation offset value.

15. The radio frequency channel of claim 14 wherein the phase compensation component and the phase-locked loop components are operated repeatedly in parallel.

16. The radio frequency channel of claim 14 wherein the phase-locked loop component further includes an amplifying component configured to amplify the power of the phase-shifted signal.

17. The radio frequency channel of claim 14 wherein the phase-locked loop component further includes a phase-measuring component configured to measure the phase difference between one of the set of reference signals and the phase-shifted output signal.

18. The radio frequency channel of claim 14 wherein the phase compensation component further includes a phase-measuring component configured to measure the phase difference between two reference signals of the set of reference signals.

19. The radio frequency channel of claim 17 wherein the phase-measuring component comprises a double balanced mixer.

20. The electromagnetic energy delivery system of claim 14 wherein the set of reference signals is directly coupled to a switching matrix that is configured to output one of the set of reference signals to the phase-locked loop component.

* * * * *